(12) United States Patent
Bytheway et al.

(10) Patent No.: US 11,069,163 B2
(45) Date of Patent: Jul. 20, 2021

(54) CLOSURE MEMBER SENSOR

(71) Applicant: Cirque Corporation, West Valley City, UT (US)

(72) Inventors: Jared Bytheway, Sandy, UT (US); Ethan Sturm, Salt Lake City, UT (US)

(73) Assignee: Cirque Corporation, Sandy, UT (US)

( * ) Notice: Subject to any disclaimer, the term of this patent is extended or adjusted under 35 U.S.C. 154(b) by 0 days.

(21) Appl. No.: 16/668,569

(22) Filed: Oct. 30, 2019

(65) Prior Publication Data

US 2021/0134091 A1 May 6, 2021

(51) Int. Cl.
*G08B 29/00* (2006.01)
*G07C 9/00* (2020.01)
*G01R 27/26* (2006.01)

(52) U.S. Cl.
CPC ..... *G07C 9/00182* (2013.01); *G01R 27/2605* (2013.01)

(58) Field of Classification Search
CPC .................. G07C 9/00182; G01R 27/2605
USPC ......................................................... 340/5.7
See application file for complete search history.

(56) References Cited

U.S. PATENT DOCUMENTS

| 10,027,503 | B2* | 7/2018 | Patrick | ............... | H04N 21/4131 |
| 2001/0030626 | A1* | 10/2001 | Saito | ...................... | H01Q 1/244 |
| | | | | | 343/702 |
| 2009/0140858 | A1* | 6/2009 | Gore | ...................... | G08B 13/04 |
| | | | | | 340/547 |
| 2009/0193859 | A1* | 8/2009 | Kwon | .................... | E05B 47/026 |
| | | | | | 70/91 |
| 2010/0171588 | A1* | 7/2010 | Chutorash | ............. | E05F 15/668 |
| | | | | | 340/5.71 |
| 2015/0116097 | A1* | 4/2015 | Cregg | ................. | H04L 27/2601 |
| | | | | | 340/13.22 |
| 2015/0121758 | A1* | 5/2015 | Pohl | ........................ | E05F 15/73 |
| | | | | | 49/28 |
| 2015/0267454 | A1* | 9/2015 | Wuerstlein | .............. | E05F 15/46 |
| | | | | | 701/49 |
| 2017/0186256 | A1* | 6/2017 | Dumas | .................... | E05B 47/06 |
| 2017/0356238 | A1* | 12/2017 | Gitman | ................... | G08B 13/08 |
| 2017/0362856 | A1* | 12/2017 | Almomani | .......... | E05B 15/0205 |
| 2019/0040653 | A1* | 2/2019 | Baumgarte | .............. | G01B 7/24 |
| 2019/0178003 | A1 | 6/2019 | Martin | | |

FOREIGN PATENT DOCUMENTS

WO 2011019406 2/2011

\* cited by examiner

*Primary Examiner* — Naomi J Small

(57) ABSTRACT

An apparatus may include a capacitance sensor, a processor in communication with the capacitance sensor, and memory having programmed instructions that cause the processor, when executed, to determine a closure status of a closure member based on a measurement from the capacitance sensor.

16 Claims, 22 Drawing Sheets

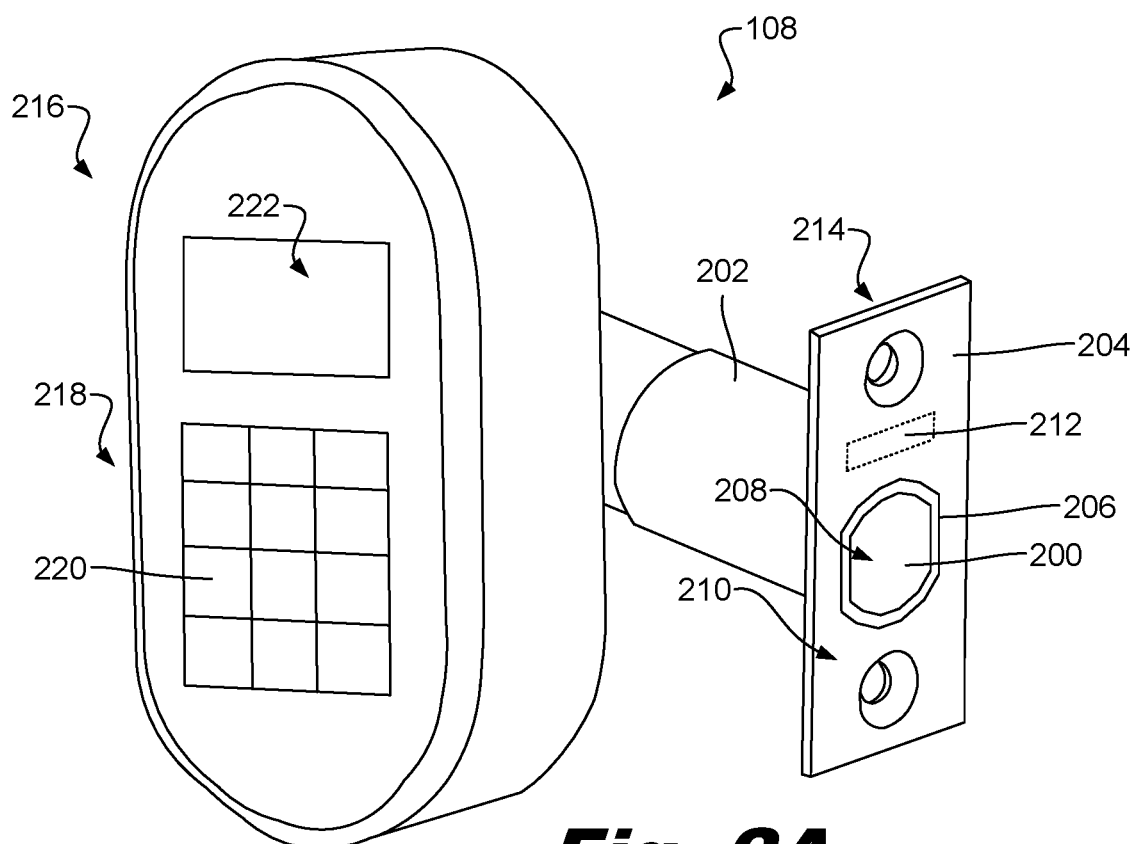
*Fig. 2A*
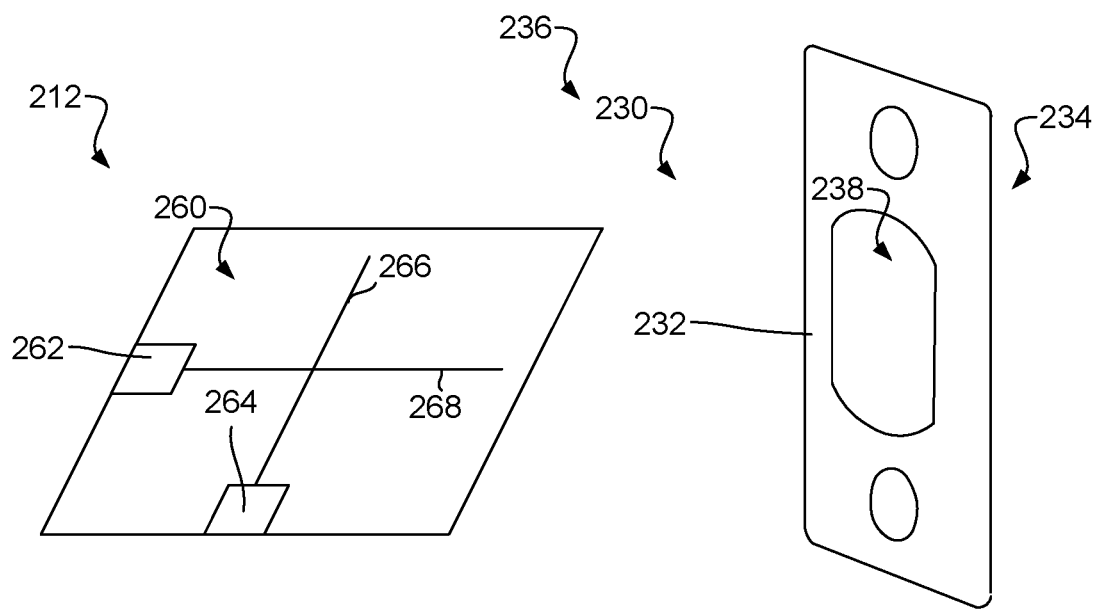
*Fig. 2B*
*Fig. 2C*

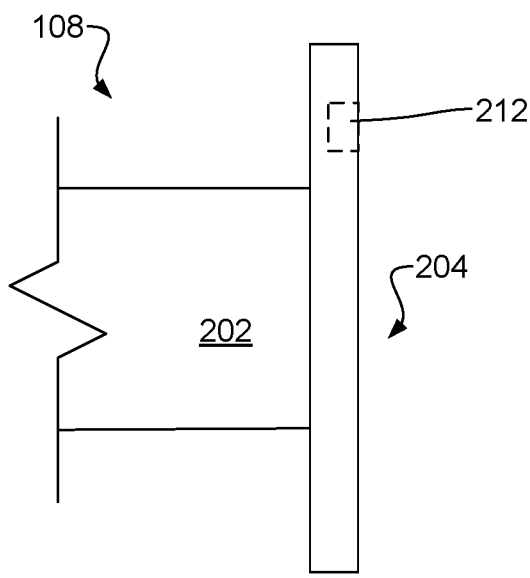
Fig. 2D
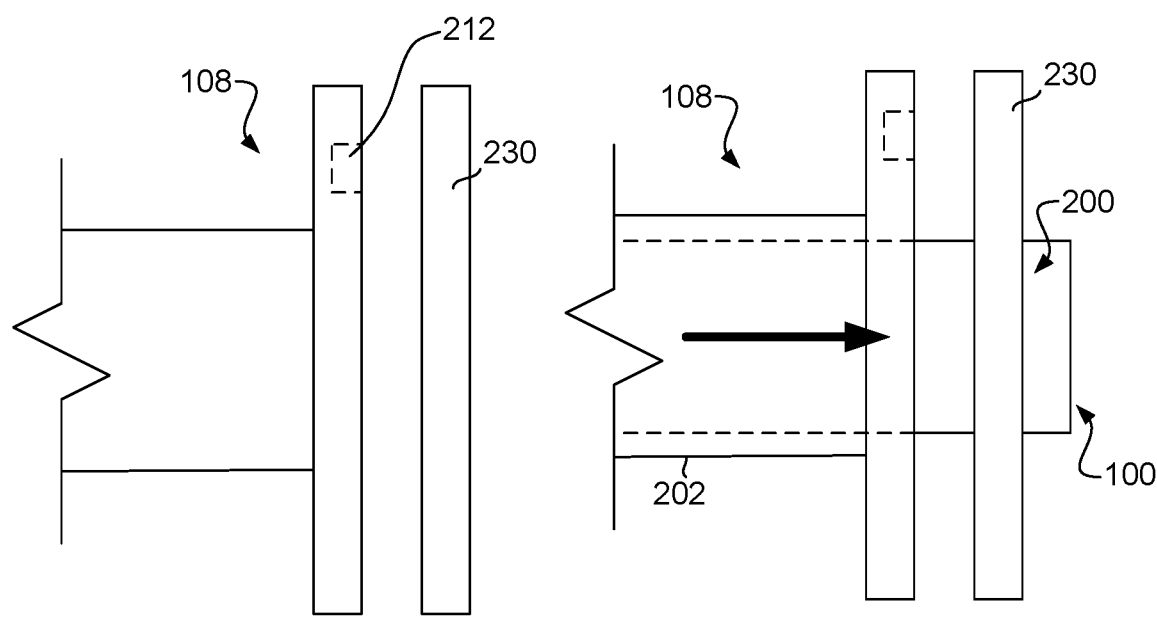
Fig. 2E  Fig. 2F

Fig. 20A  Fig. 20B

CLOSURE MEMBER SENSOR

BACKGROUND

A smart lock is an electromechanical locking device that is configured to lock or unlock a door in response to receiving instructions, such as from a user's phone or a touch pad incorporated into the smart lock. Some smart locks incorporate a magnetic sensor to determine the position of the door.

An example of a magnetic sensor in a smart lock is disclosed in U.S. Patent Publication No. 2009/0193859 issued to Michael Kwon, et al. This reference describes an automatic locking system includes a magnetic sensor and a magnet. The magnetic sensor sends a signal if the proximity to the magnet equals or is less than a predetermined distance. A controller drives a motor to extend a throw bolt in response to receiving the signal from the magnetic sensor. An electronic deadbolt includes the automatic locking system. The magnetic sensor is arranged in a deadbolt assembly inside the door on which the electronic deadbolt is arranged, and the magnet is arranged in or adjacent to a strike lining box on the door frame so the automatic locking system is hidden from view. An electronic deadbolt includes a master function that may be activated or deactivated by a user. If the master function is activated, a master passcode and master tag may be used to operate the electronic deadbolt and access programming buttons. This reference is herein incorporated by reference for all that it discloses.

SUMMARY

In one embodiment of the present disclosure, an apparatus may include a capacitance sensor, a processor in communication with the capacitance sensor, and memory having programmed instructions that cause the processor, when executed, to determine a closure status of a closure member based on a measurement from the capacitance sensor.

The apparatus may further include a locking mechanism in communication with the processor.

The capacitance sensor may be incorporated into the locking mechanism.

The capacitance sensor may be incorporated into a face plate of the locking mechanism.

The capacitance sensor may be incorporated into a movable member of the locking mechanism.

The programmed instructions may cause the processor, when executed, to move a movable member incorporated into the locking mechanism.

The programmed instructions may cause the processor, when executed, to extend the movable member outward when the closure status of the closure member is closed.

The capacitance sensor may be incorporated into the closure member.

The capacitance sensor may be incorporated into a closure member frame around the closure member.

The capacitance sensor may be incorporated into a striker plate.

The programmed instructions may determine that the closure status is closed when the capacitance measurement is high.

The programmed instructions may determine that the closure status is open when the capacitance measurement is low.

An apparatus may include a locking mechanism, a movable member incorporated into the locking mechanism, a capacitance sensor incorporated into the locking mechanism, a processor in communication with the capacitance sensor, and memory having programmed instructions that cause the processor, when executed, to receive a capacitance measurement from the capacitance sensor, and move the movable member in response to the capacitance measurement.

The locking mechanism may include a capacitance input.

The processor may include an integrated circuit configured to interpret inputs from the capacitance input.

The integrated circuit may be configured to interpret inputs from the capacitance sensor.

The movable member may be a dead bolt.

A computer program product may include a non-transitory computer readable medium storing instructions executable by a processor to determine a closure status of a closure member based on a capacitance measurement from the capacitance sensor.

The instructions may be executable by the processor to extend a movable member of a locking mechanism based on the closure status of the closure member.

The instructions may be executable by the processor to extend a deadbolt of a locking mechanism when the capacitance measurement is above a baseline threshold.

BRIEF DESCRIPTION OF THE DRAWINGS

A further understanding of the nature and advantages of the present invention may be realized by reference to the following drawings. In the appended figures, similar components or features may have the same reference label.

FIG. 2A depicts an example of a locking mechanism according to the present disclosure.

FIG. 2B depicts an example of a capacitance sensor according to the present disclosure.

FIG. 2C depicts an example of a striker plate according to the present disclosure.

FIG. 2D depicts an example of a locking mechanism when a closure member is open according to the present disclosure.

FIG. 2E depicts an example of a locking mechanism when a closure member is closed according to the present disclosure.

FIG. 2F depicts an example of movement of a movable member of a locking mechanism according to the present disclosure.

FIG. 20A depicts an example of a capacitance sensor incorporated into a movable member according to the present disclosure.

FIG. 20B depicts an example of a capacitance sensor in an extended position according to the present disclosure.

DETAILED DESCRIPTION OF THE INVENTION

Figure 1:
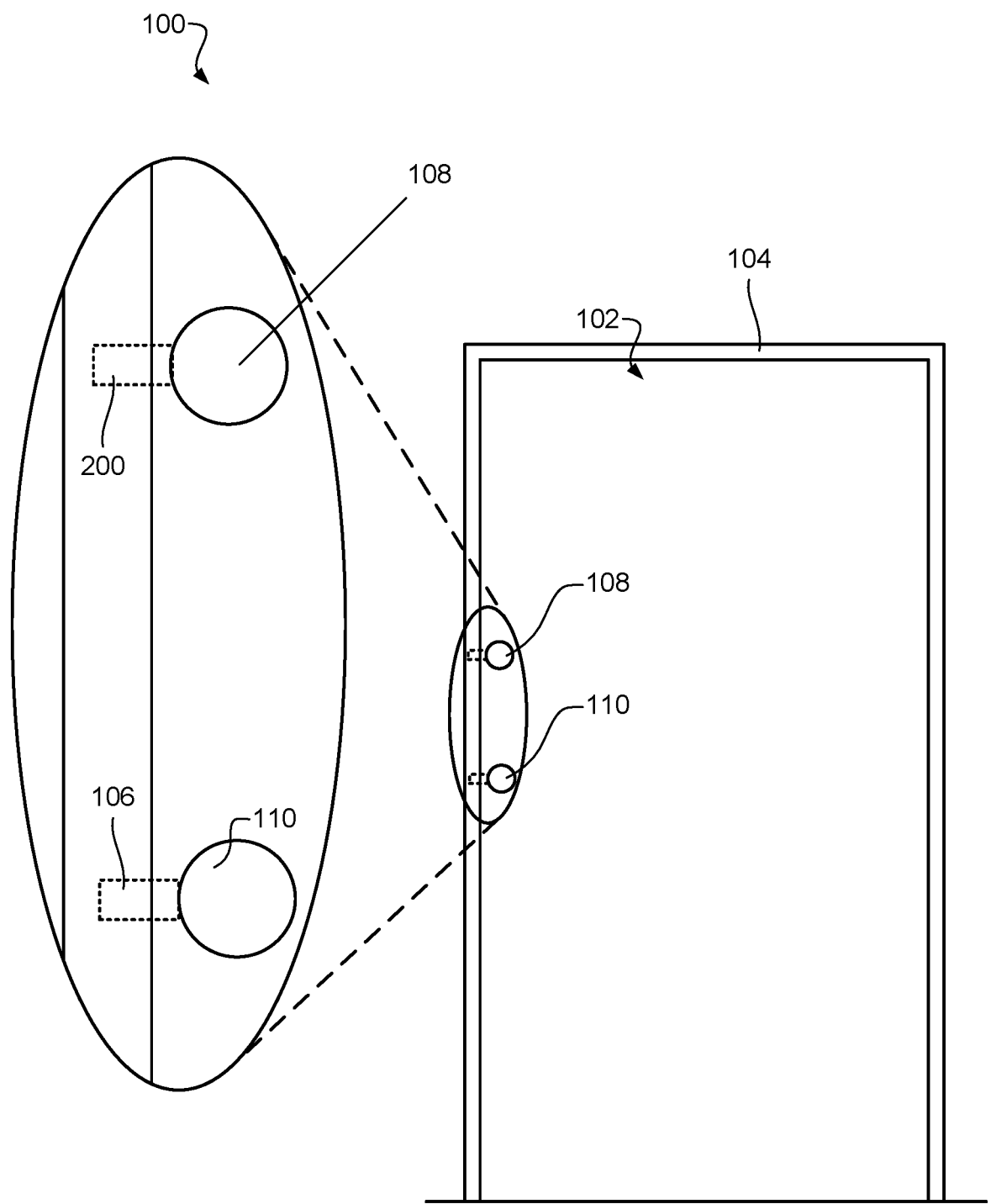
FIG. 1 depicts an example of an assembly that includes a closure member according to the present disclosure.

This description provides examples, and is not intended to limit the scope, applicability or configuration of the invention. Rather, the ensuing description will provide those skilled in the art with an enabling description for implementing embodiments of the invention. Various changes may be made in the function and arrangement of elements.

Thus, various embodiments may omit, substitute, or add various procedures or components as appropriate. For instance, it should be appreciated that the methods may be performed in an order different than that described, and that various steps may be added, omitted, or combined. Also, aspects and elements described with respect to certain embodiments may be combined in various other embodiments. It should also be appreciated that the following systems, methods, devices, and software may individually or collectively be components of a larger system, wherein other procedures may take precedence over or otherwise modify their application.

For purposes of this disclosure, the term "aligned" generally refers to being parallel, substantially parallel, or forming an angle of less than 35.0 degrees. For purposes of this disclosure, the term "transverse" generally refers to perpendicular, substantially perpendicular, or forming an angle between 55.0 and 125.0 degrees. For purposes of this disclosure, the term "length" generally refers to the longest dimension of an object. For purposes of this disclosure, the term "width" generally refers to the dimension of an object from side to side and may refer to measuring across an object perpendicular to the object's length.

For purposes of this disclosure, the term "closure status" generally refers to a status of closure member, such as a door. For example, the closure status may include that the door is open, that the door is closed, that a movable member (e.g. bolt, plunger, latch, etc.) of a locking mechanism incorporated into the door is aligned with the receptacle to receive the movable member, that the movable member is aligned with an opening defined in a striker plate, that the door is adjacent to the door jamb, that the door is nested within the door frame, that a movable member of a locking mechanism incorporated into the door is misaligned with the receptacle to receive the movable member, that the movable member is misaligned with an opening defined in a striker plate, that the door is misaligned with the door frame, another type of status, or combinations thereof.

For purposes of this disclosure, the term "closure member" generally refers to a member of an assembly that can be closed. For example, a closure member may include a door, a sliding door, a hinged door, a French door, an interior door, an exterior door, a garage door, a window, a drawer, a removable lid, another type of door, a hinged covering, another type of component that can close an assembly, or combinations thereof. In some examples, the closure member may be incorporated into a building, a wall, a cabinet, a vehicle, a vault, a container, a gate, a cooking device (e.g. a grill, an oven, etc.), a washing machine, a dryer, a washer, another type of assembly, or combinations thereof.

For the purposes of this disclosure, the term "locking mechanism" generally refers to mechanism that can lock or hold the closure member in place when the closure member is closed. For example, the locking mechanism may be a dead bolt assembly, a smart lock, a latch assembly, a plunger assembly, a knob lock, a lever lock, another type of lock, or combinations thereof. For purposes of this disclosure, the term "movable member" generally refers to a member that can move from one position to another. In some examples, the movable member may include a plunger, a dead latch plunger, a bolt, a dead bolt, a latch, a latch bolt, a slider, a hook, a rod, another type of movable member, or combinations thereof. For purposes of this disclosure, the term "capacitance input" generally refers to an input that uses an electrical capacitance effect to detect touch. For example, the capacitance input may include a touch sensor, a proximity sensor, a mutual capacitance input, a self-capacitance input, a capacitance display, another type of capacitance input, or combinations thereof.

FIG. 1 depicts an example of an assembly 100 that includes a closure member 102. In this example, the closure member 102 is a door, and the assembly 100 includes a door frame 104, a door latching mechanism 106, and a locking mechanism 108. In this illustrated example, the locking mechanism 106 includes a door knob 110 that can be rotated by a user to control a position of a latch of the door latching mechanism 106. In other examples, the door latching mechanism may include levers or other types of features that control the position of the latch. Also, in this illustrated example, the locking mechanism includes a movable member 200, such as a bolt, that is movable based on use of a key or operation of a smart lock. While not shown in the example of FIG. 1, the door frame may include a striker plate positioned adjacent to the door latching mechanism 106, a striker plate positioned adjacent to the locking mechanism 108, a door jamb, other features incorporated into a door frame, or combinations thereof.

FIG. 2A depicts an example of a locking mechanism 108. In this example, the locking mechanism 108 is a smart lock that includes a movable member 200, such as a bolt, that is movable between a retracted position and an extended position. In the example of FIG. 2A, the movable member 200 is depicted in the retracted position. The movable member 200 is positioned to move between the extended and retracted positions within a channel of a barrel 202 of the locking mechanism 108. In this example, the locking mechanism 108 includes a face plate 204, which is positioned so that an opening 206 of the face plate 204 surrounds a portion of the movable member 200. In this example, when the movable member 200 is in the retracted position, the distal end 208 of the movable member 200 is flush with the outward facing surface 210 of the face plate 204. However, in other examples, the movable member 200 may not be flush with the outward facing surface 210 of the face plate 204 when the movable member is in the retracted position.

In some cases, the face plate 204 is integrally formed with the barrel 202. In other examples, these components are formed separately. Further, in other examples, no face plate is incorporated into the locking mechanism 108. The face plate 204 may be made of any appropriate material, such as a metal, steel, stainless steel, a plastic, an electrically conductive material, an electrically insulating material, a magnetically conductive material, a non-magnetic material, another type of material, or combinations thereof.

The locking mechanism 108 may include a control panel 216. The control panel 216 may include at least one capacitance input 218. The capacitance input 218 may be incorporated into buttons 220 of the control panel 216, a touch screen 222 of the control panel 216, another feature of the control panel 216, or combinations thereof. In some examples, the control panel does not include a capacitance input, but rather includes other types of inputs, such as electrical switches, electrical resistance inputs, levels, dials, mechanical switches, other types of inputs, or combinations thereof.

The control panel 216 may be used to display information or control at least one function of the locking mechanism 108. Examples of information that the control panel 216 may display include a time, date, an ambient temperature, a closure member status, a warning, an alert, another type of information, or a combination thereof. A function that may be controlled with the control panel 216 may include moving the position of the movable member 200. A user may use the control panel 216 to control the position of the movable member 200. In other examples, a message may be sent to the control panel 200, such as through a home automation system, a smart phone, a wireless device, an electronic tablet, a networked device, a computing device, another type of device, or combinations thereof. In some cases, the control panel 216 can receive commands for controlling the position of the movable member through inputs directly into the control panel 216 or through wireless signals.

In the illustrated example, a capacitance sensor 212 is attached to the material of the face plate 204. For example, the capacitance sensor 212 may be incorporated into the face plate 204 such that at least a portion of the capacitance sensor is disposed within the thickness of the face plate 204 between the outwardly facing surface 210 and a back surface 214 of the face plate 204. For example, a recess may be formed in the face plate 204 through a subtractive process or an additive process, and the capacitance sensor 212 may be positioned within the recess. In other examples, the capacitance sensor 212 may be attached to the back surface 214 or the outwardly facing surface 210 of the face plate 204. The capacitance sensor may be positioned at any appropriate position on the face plate 204.

FIG. 2B an example of a capacitance sensor. The capacitance sensor 212 may include at least one electrode. The electrode may be an electrically conductive material. In some cases, the electrode is deposited on a printed circuit board 260. The electrode may be part of a grid of electrodes. In some cases, a measurement sensor 262 may be connected to the electrode, which may measure an electrical characteristic of the electrode. In some cases, the measurement sensor is configured to measure a voltage on a portion of the electrode, an electrical current on a portion of the electrode, another electrical characteristic of the electrode, or combinations thereof.

In at least one example, the capacitance sensor 212 can detect changes in capacitance between a transmit electrode and a sense electrode in the grid. For example, a power source 264 may apply a voltage on the transmit electrode, which generates a first capacitance between the transmit electrode 266 and the sense electrode 268. This first capacitance can be determined by measuring a voltage or a current on the sense electrode. When an electrically conductive object approaches an intersection between the transmit electrode and the sense electrode, the electrically conductive object affects the capacitance at the intersection between the transmit and sense electrodes. As a result, the voltage and/or current measurements on the sense electrode change. Thus, the presence of the approaching object can be detected.

In other examples, electrode may be used with a self-capacitance method to determine the presence of an adjacent electrically conductive object. In this example, a capacitance value between the approaching electrically conductive object and the electrode may change as the object approaches. Thus, the presence of an electrically conductive object may be detected using a self-capacitance sensor or a mutual capacitance sensor.

In some examples, the electrode may be in communication with an integrated circuit of the control panel 216. Thus, the capacitance measurements may be determined by the integrated circuit. The measurements from the capacitance sensor 212 may be determined at the capacitance sensor 212 or at the control panel. In some cases where the control panel 216 includes capacitance inputs, the control panel 216 may include a processor, hardware, software, firmware, other components, or combinations thereof that can interpret capacitance measurements. In this example, the integrated circuit of the control panel 216 can be also used to interpret the measurements from the capacitance sensor 212.

In some cases, an electrically conductive path can connect the sense electrode from a mutual capacitance sensor or a self-capacitance sensor to the integrated circuit of the control panel 216. In just one example, a wire, a trace, or another type of electrically conductive pathway can connect a printed circuit board with the sense electrode deposited thereon to the control panel 216. In some cases, such a wire may be routed through the barrel 202, face plate 204, other components of the locking mechanism 108, or combinations thereof. In yet other examples, the sense electrode of the capacitance sensor may be in communication with a transmitter that sends a wireless signal to the control panel 216.

While FIG. 2B depicts an example of a capacitance sensor, any appropriate type of capacitance sensor may be used. For example, the capacitance sensor may include multiple transmit electrode, multiple sense electrodes, other types of electrode arrangements, or combinations thereof.

FIG. 2C depicts an example of a striker plate 230. The striker plate 230 may be positioned on a component of the assembly having the closure member. For example, the striker plate 230 may be secured to a door frame at a position that is aligned with the movable member of the locking mechanism when the closure member is closed. In the example of FIG. 2C, the striker plate 230 includes a forward facing surface 232, a back surface 234, fastener openings 236, and an opening 238. In some examples, when the closure member is closed, the movable member may be moved to the extended position such that distal end of the movable member is inserted into the opening 238.

The striker plate 230 may be made of an electrically conductive material. In some cases, the entire striker plate 230 is made of an electrically conductive material, but in some situations, just a portion of the striker plate 230 may be made of an electrically conductive material. For example, a base material of the striker plate 230 may be made of an electrically conductive material while a coating of the striker plate 230 is not electrically conductive or vice versa. A non-exhaustive list of materials that the striker plate may be made of includes, but is not limited to metal, steel, stainless steel, zinc, aluminum, nickel, chrome, brass, an electrically conductive material, another type of material, or combinations thereof.

FIG. 2D depicts an example of a locking mechanism 108 when a closure member is open. In this example, the barrel 202 and face plate 204 are depicted, and the capacitance sensor 212 is embedded into the face plate 204. The movable member is in the retracted position and thus obscured from view by the barrel 202. With the closure member open, the capacitance sensor 212 embedded into the face plate 204 is positioned away from the striker plate. Thus, in this example, the electrically conductive material of the striker plate does not affect the capacitance measured by the capacitance sensor 212. Thus, the capacitance sensor 212 may measure a baseline level of capacitance. In some examples, when a baseline level of capacitance is measured the system may determine that the closure status of the closure member is open. In other examples, the closure status may include that the locking mechanism is misaligned with the striker plate or another type of closure status.

FIG. 2E depicts an example of a locking mechanism 108 when a closure member is closed. With the closure member closed, the capacitance sensor 212 is in proximity to the striker plate 230. In this example, the striker plate 230 is close enough to the capacitance sensor 212 that the striker plate's electrically conductive material changes the measurements of the capacitance sensor 212. In some examples, the presence of the striker plater 230 causes an increase in the capacitance measured by the capacitance sensor 212.

The change in capacitance may be processed at the capacitance sensor 212 or at the integrated circuit of the control panel. When a threshold change in capacitance is exceeded, the system may determine that the closure member is closed. In other examples, the closure status may include that the locking mechanism is aligned with the striker plate or another type of closure status.

FIG. 2F depicts an example of movement of a movable member 200 of a locking mechanism 108. In this example, the measurements of the capacitance sensor cause a determination that the closure member is closed or that the locking mechanism and the striker plate are aligned. In response to determining an appropriate closure status, the movable member 200 is moved out of the barrel 202 so that the distal end 208 of the movable member 200 is inserted into the opening of the striker plate 230 thereby locking the closure member in place.

Figure 2G:
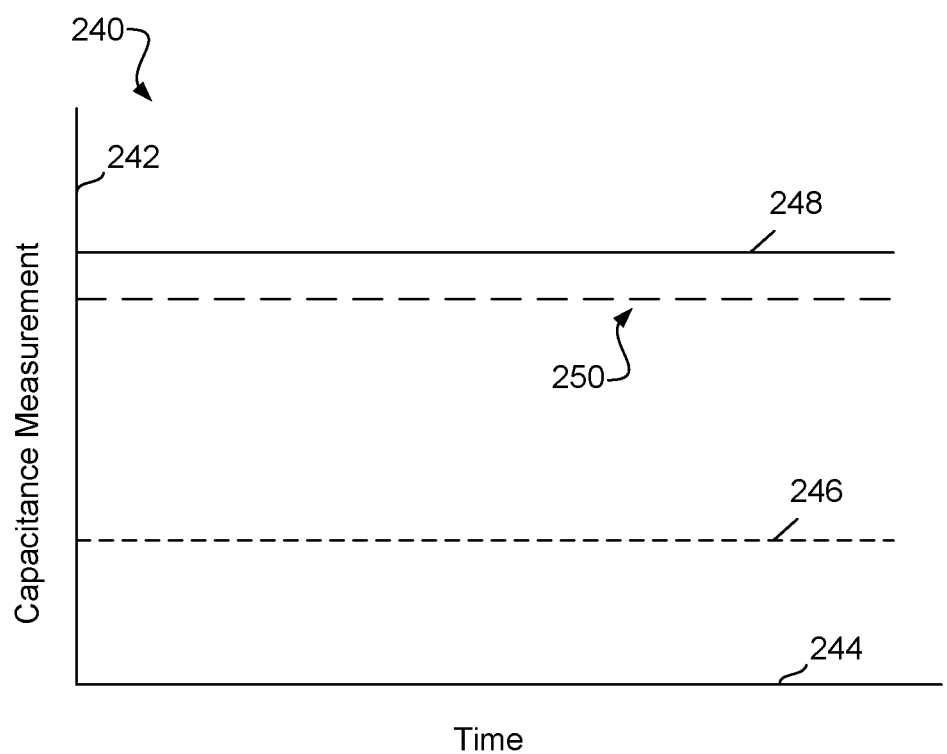
FIG. 2G depicts an example of a capacitance measurement according to the present disclosure.

FIG. 2G depicts an example of a capacitance measurement. A chart 240 includes a horizontal axis 242 that schematically represents a capacitance measurement and a vertical axis 244 that schematically represents time. A first line 246 schematically represents a baseline capacitance measurement that may be representative of when a closure member is open. A second line 248 schematically represents a higher capacitance measurement that may exceed a threshold level 250. In this example, the threshold level 250 may represent a level that the programmed instructions of the control panel or capacitance sensor used as the minimum level necessary to determine a closed and/or aligned closure status of the closure member. In this example, the higher capacitance measurement 248 may represent the actual measurement when the closure member is closed. In this example, the system may determine that the closure member is closed, aligned, or another closure status because the higher capacitance line is above the threshold level 250.

Figure 3:
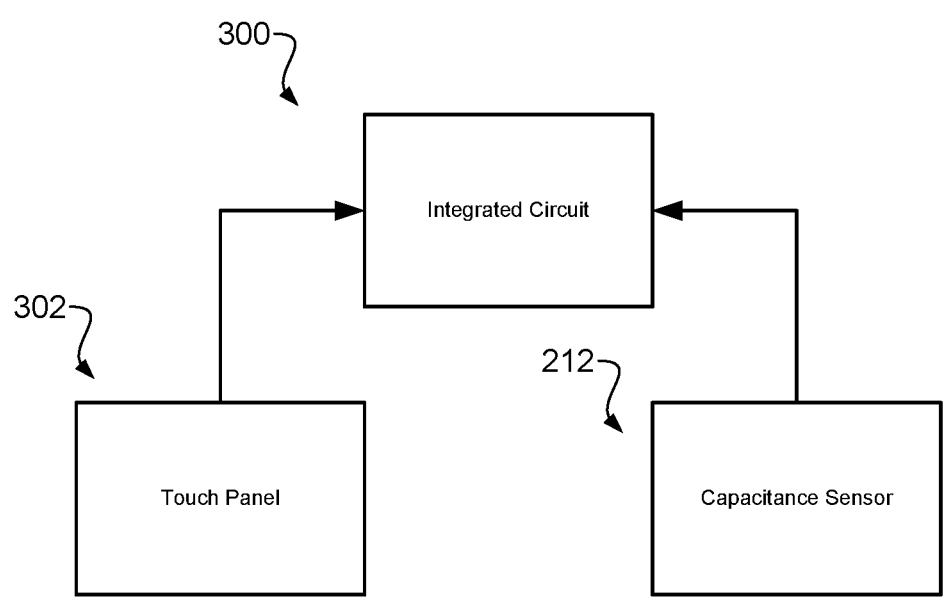
FIG. 3 depicts an example of an integrated circuit in communication with both a touch panel and a capacitance sensor according to the present disclosure.

FIG. 3 depicts an example of an integrated circuit 300 in communication with both a touch panel 302 and a capacitance sensor 212. In this example, the touch panel 302 and the integrated circuit 300 may be part of the control panel that executes the functions of the locking mechanism. For example, the integrated circuit 300 may cause the closure member to lock or unlock. The touch panel 302 may include at least one mutual capacitance sensor and/or at least one self-capacitance sensor to determine touch and/or proximity commands from a user. The capacitance measurements measured at the touch panel 302 may be interpreted by the integrated circuit 302. The capacitance sensor integrated into the locking mechanism may use the same integrated circuit to interpret the measurements from the capacitance sensor 212.

In some examples, the assembly or the closure member may include a capacitance sensor 212 that is located in a location away from the locking mechanism. For example, the capacitance sensor 212 may be located on a door frame, a door jamb, on a forward facing surface of a door, on a surface of a closure member, another location, or combinations thereof. In the examples where the capacitance sensor is not incorporated into the locking mechanism, the capacitance sensor 212 may still send measurements to the integrated circuit 300 of a smart lock or another type of locking mechanism 108 to interpret the measurements. The measurements may be sent through hard wires or through a wireless transmitter.

Figure 4:
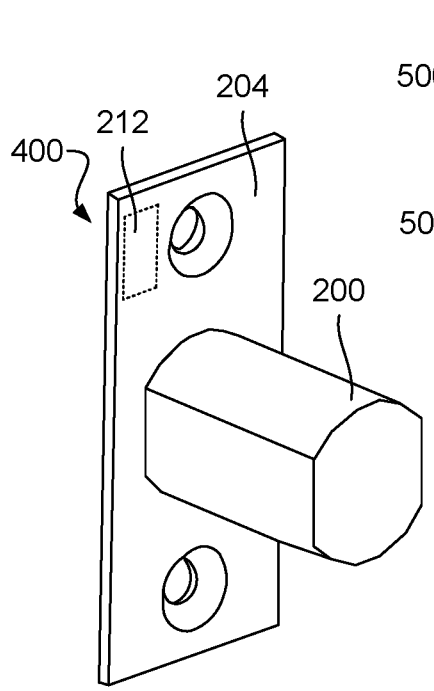
FIG. 4 depicts an alternative example of a capacitance sensor incorporated into a locking mechanism according to the present disclosure.

FIGS. 4-8 depict alternative examples of capacitance sensors 212 incorporated into a locking mechanism 108. In the example of FIG. 4, the capacitance sensor 212 is located in a corner 400 of the face plate 204. In some examples, when the movable member 200 is in the extended position, an electrically conductive material making up the movable member 200 may affect the capacitance measured by the capacitance sensor 212 if the capacitance sensor 212 is located close to the opening in the face plate 204. In some examples where the capacitance sensor 212 is located farther away from the opening in the face plate 204, such as in a far corner, the capacitance effects of the movable member 200 may be lower than if the capacitance sensor 212 was located closer to the opening of the face plate 204 when the movable member 200 is extended.

Figure 5:
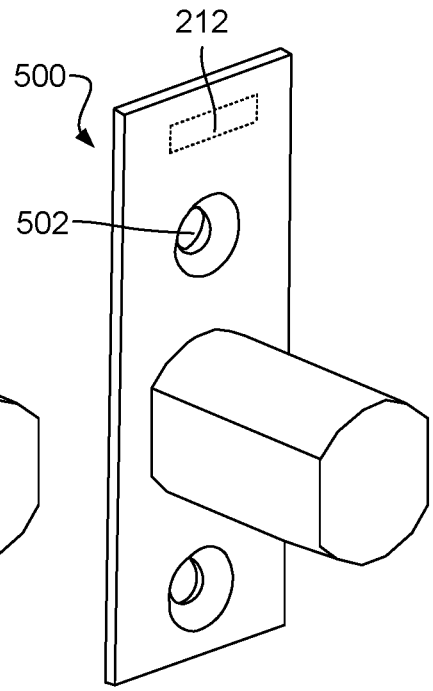
FIG. 5 depicts an alternative example of a capacitance sensor incorporated into a locking mechanism according to the present disclosure.
Figure 6:
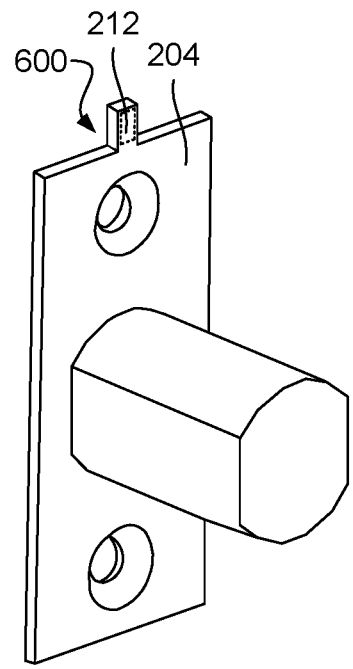
FIG. 6 depicts an alternative example of a capacitance sensor incorporated into a locking mechanism according to the present disclosure.

FIG. 5 depicts a capacitance sensor 212 located on a far side 500 of the face plate 204 past a fastener opening 502 defined in the face plate 204. FIG. 6 depicts an example where the capacitance sensor 212 is located in a protrusion 600 that extends away from a main body 602 of the face plate 204.

Figure 7:
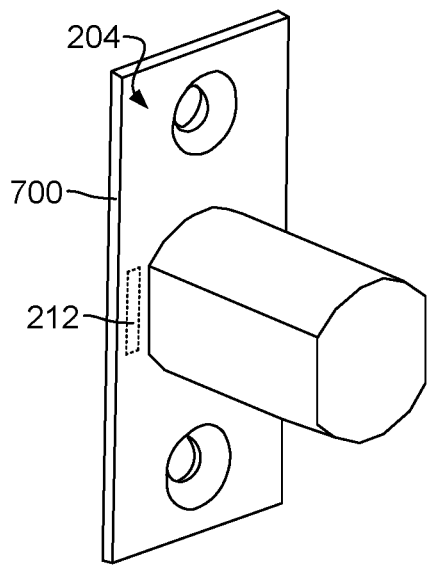
FIG. 7 depicts an alternative example of a capacitance sensor incorporated into a locking mechanism according to the present disclosure.
Figure 8:
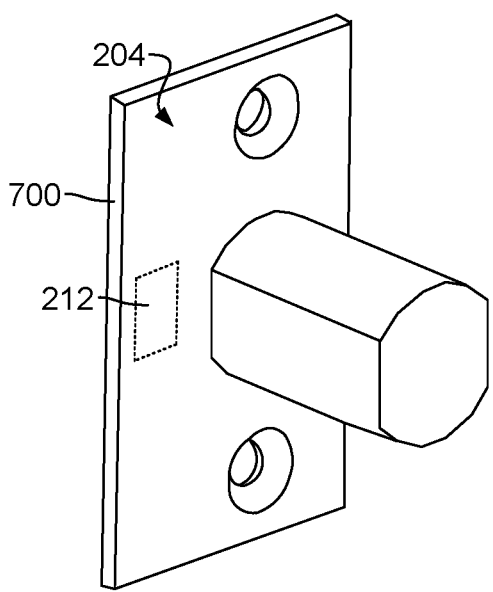
FIG. 8 depicts an alternative example of a capacitance sensor incorporated into a locking mechanism according to the present disclosure.

FIG. 7 depicts an example of the capacitance sensor 212 being located adjacent to the opening and to an edge 700 of the face plate 204. In some examples where the capacitance sensor 212 is located near the far edge 700 of the face plate 204, the closure member may have to be aligned before the capacitance sensor 212 detects a change in capacitance. If the closure member is only partially aligned, the capacitance sensor 212 may not be brought into close enough proximity to the striker plate to registered a significant enough change in capacitance. FIG. 8 depicts an example of a wider face plate 800 that locates the capacitance sensor 212 on a far edge 700 and farther away from the face plate's opening.

While the capacitance sensor has been described as being incorporated into various portions of the face plate or other portions of the locking mechanism, the capacitance sensor may be incorporated into any appropriate locations of the face plate and/or other portions of the locking mechanism. Further, more than one capacitance sensor may be incorporated into the face plate or other portions of the locking mechanism at different locations.

FIGS. 9-12 depict alternative examples of a capacitance sensor 212 being incorporated into a striker plate 900. In some examples, the capacitance sensor 212 may be positioned in the striker plate 900 to sense when the face plate, movable member of the locking mechanism, another part of the locking mechanism, another part of the closure member, or combinations thereof are in proximity to the striker plate 900. When the closure member is closed, an object of the closure member (e.g. face plate, movable member, locking mechanism, etc.) may cause the capacitance sensor 212 in the striker plate 900 to measure a higher capacitance. On the other hand, the capacitance sensor 212 may measure a lower capacitance when the closure member is open.

In some cases, the capacitance measurement may increase when the closure member is mostly closed and the striker plate 900 and the locking mechanism are not completely aligned. In some of these cases where there is misalignment, the capacitance measurement may fall between the highest capacitance measurement when the striker plate 900 and locking mechanism are aligned and the lowest capacitance when the closure member is open. In some cases, the system may classify such a misalignment as an open closure member, a misaligned closure member, another classification, or combinations thereof. In these types of situations, the system may cause a message to be sent to the user about the misalignment. Further, when a misalignment is detected, the system may not send instructions to cause the movable member to extend outward to the opening of the striker plate 900.

Figure 9:
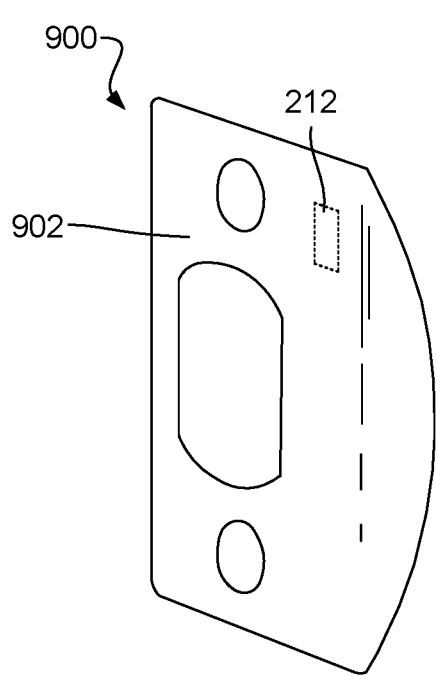
FIG. 9 depicts an alternative example of a capacitance sensor incorporated into a striker plate according to the present disclosure.
Figure 10:
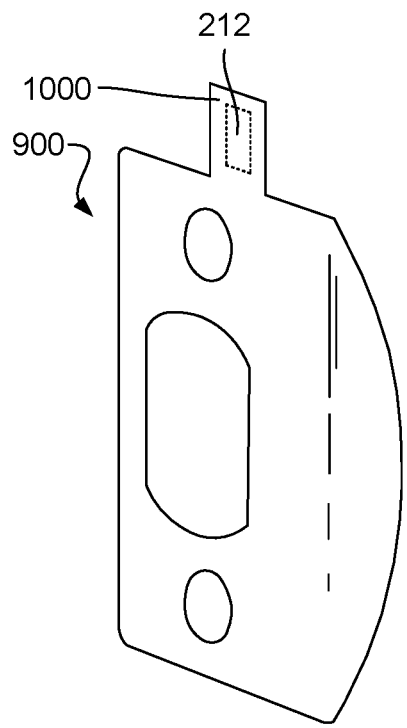
FIG. 10 depicts an alternative example of a capacitance sensor incorporated into a striker plate according to the present disclosure.
Figure 11:
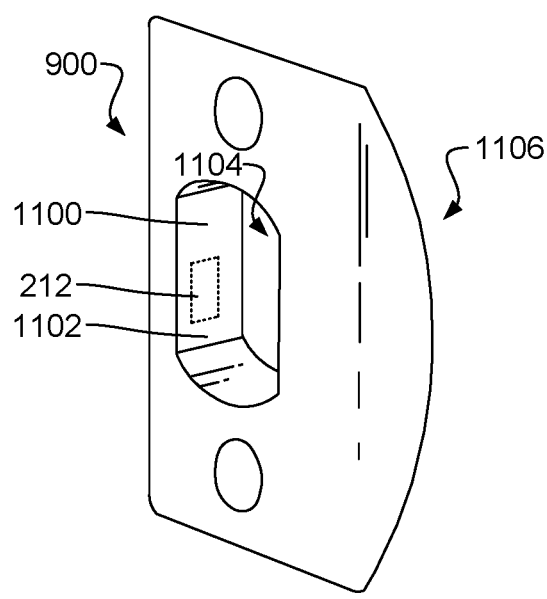
FIG. 11 depicts an alternative example of a capacitance sensor incorporated into a striker plate according to the present disclosure.

In FIG. 9, the capacitance sensor 212 is incorporated into an outwardly facing surface 902 of the striker plate 900. In the example of FIG. 10, the capacitance sensor 212 is incorporated into an extension 1000 of the striker plate 900. FIG. 11 depicts the capacitance sensor 212 located on an inside surface 1100 of a wall 1102 extending into an opening 1104 of the striker plate 900. In this example, the capacitance sensor 212 may detect the presence of when the movable member (e.g. dead bolt, latching member, plunger, etc.) is extended into the opening 1104.

In some examples, the striker plate 900 includes a curved portion 1106 that is configured to push a movable member (e.g. latch, plunger, etc.) of a latching mechanism of a closure member inwards as the closure member is in the process of closing. When the closure member is completely closed so that the movable member is aligned with the opening 1104 of the striker plate 900, the movable member may automatically extend into the opening. Thus, in examples where the capacitance sensor 212 is positioned on the inside of the opening 1104, the system may use the capacitance sensor 212 to confirm that the door has properly closed.

Figure 12:
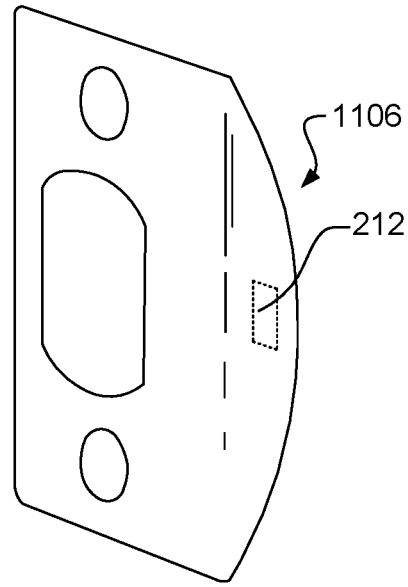
FIG. 12 depicts an alternative example of a capacitance sensor incorporated into a striker plate according to the present disclosure.

In other examples, such as the example depicted in FIG. 12, the capacitance sensor 212 may be incorporated into the curved portion 1106. In this example, the measurements from the capacitance sensor 212 may be reviewed over time to determine if the movable member moved past the curved portion 1106.

While the capacitance sensor has been described above in conjunction with FIGS. 9-12 as being incorporated into a non-exhaustive list of different portions of the striker plate, the capacitance sensor may be incorporated into other appropriate locations of the striker plate. Further, more than one capacitance sensor may be incorporated into the striker plate at different locations. Additionally, at least one capacitance sensor may be incorporated into the striker plate and at least an additional capacitance sensor may be incorporated into the locking mechanism.

Figure 13A:
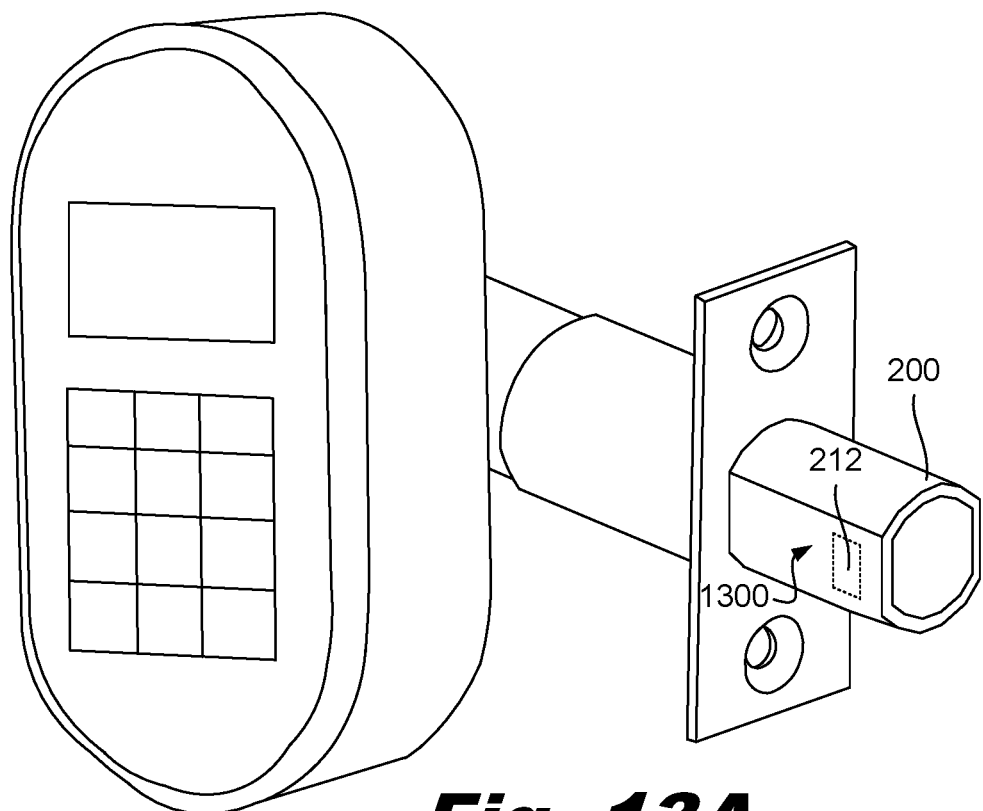
FIG. 13A depicts an example of a capacitance sensor incorporated into a movable member according to the present disclosure.
Figure 13B:
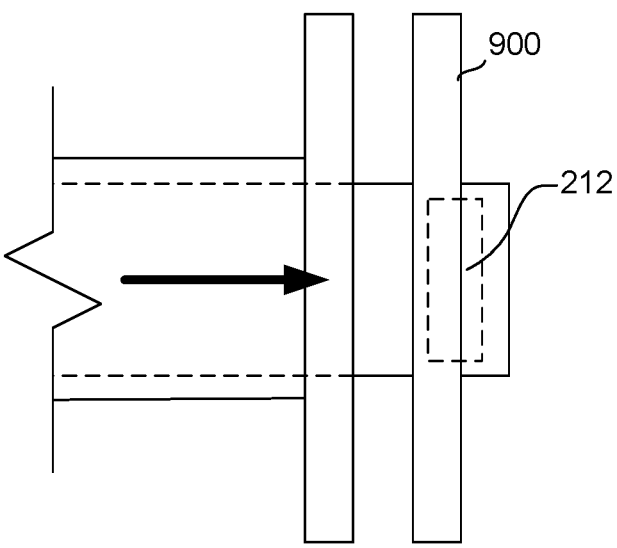
FIG. 13B depicts an example of a movable member in an extended position according to the present disclosure.

FIG. 13A depicts an example of a capacitance sensor 212 incorporated into a movable member 200. In this example, the movable member is a deadbolt of the locking mechanism 108. The capacitance sensor 212 is incorporated into a side surface 1300 of the movable member 200 that is disposed along a length of the movable member 200. FIG. 13B depicts an example of a movable member 200 with the capacitance sensor 212 extended into an opening of a striker plate 900. In this example where the locking mechanism 108 and the striker plate 900 are aligned, the capacitance sensor 212 is positioned to be adjacent to the striker plate 900. As a result, the capacitance measurement recorded by the capacitance sensor 212 at this position is higher than if the closure member was open and the movable member 200 extended into free space. In some examples, the locking mechanism may use a trigger to cause the movable member 200 to extend that is independent of the capacitance sensor 212. In this example, if the trigger is a false positive and the locking mechanism 108 causes the movable member 200 to extend when the closure member is not actually closed, the capacitance sensor's measurement can be used to determine that the closure member is open.

In examples where the closure member is open as determined by the measurement recorded by the capacitance sensor 212 and the movable member 200 is extended, the system may cause the locking mechanism 108 to retract the movable member 200. In some cases, the system may cause a message to be sent to a user to indicate that the closure member is not closed. In yet other examples where the system includes a controller that can move the closure member, the system may cause the closure member to move and then re-extend the movable member 200. The after re-extending the movable member, the measurements from the capacitance sensor 212 may be used to confirm whether the closure member is actually closed.

Figure 13C:
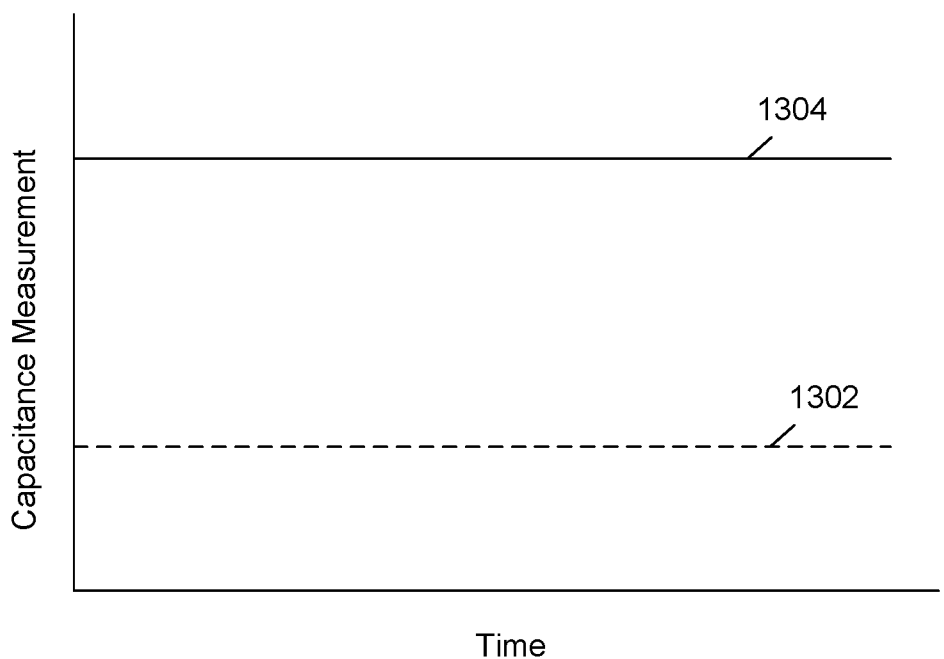
FIG. 13C depicts an example of a capacitance measurement according to the present disclosure.

FIG. 13C depicts an example of a capacitance measurement. In this example, the measurements correlate to the embodiments of FIGS. 13A and 13B where the capacitance sensor is incorporated into the side of the movable member. In this example, the baseline measurement 1302 represents a measurement when the movable member is extended into open space when the closure member is open. The other capacitance measurement 1304 that is higher than the baseline measurement 1302 represents a measurement from the capacitance sensor when the movable member is extended into the opening of the striker plate when the closure member is closed.

Figure 14A:
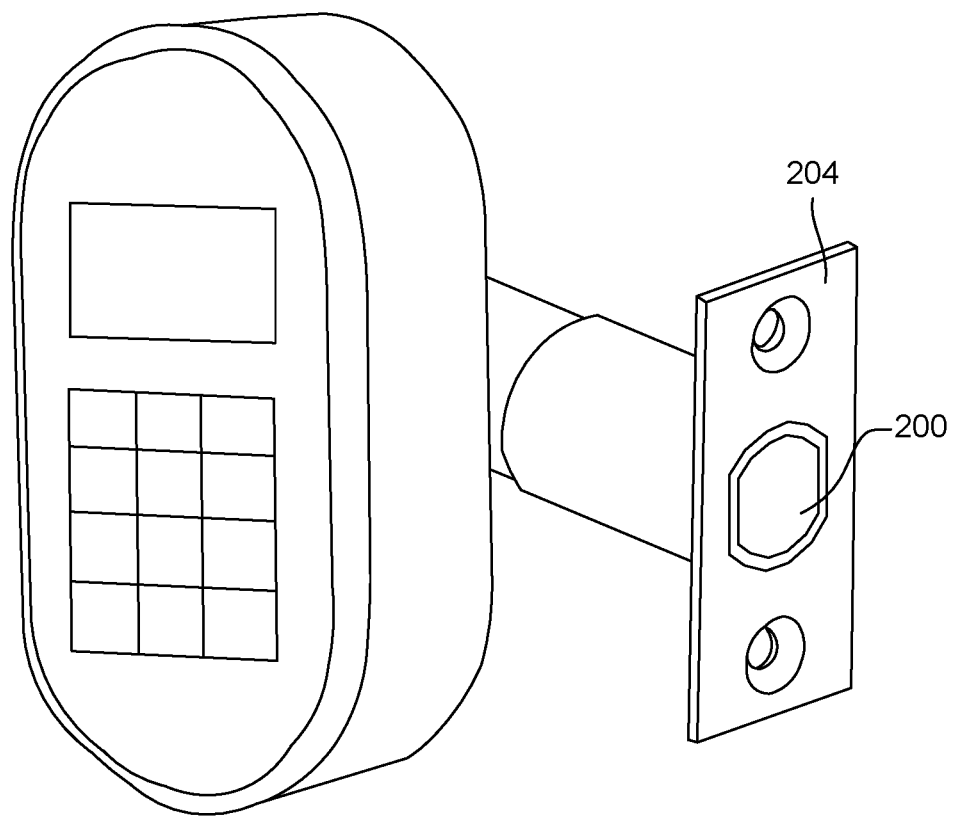
FIG. 14A depicts an example of a capacitance sensor in a retracted movable element according to the present disclosure.
Figure 14B:
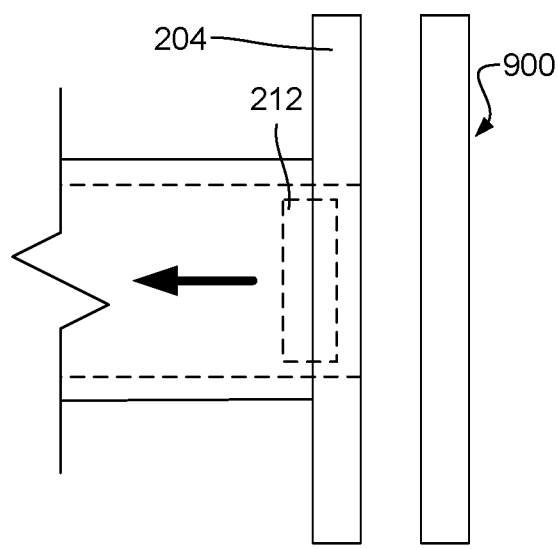
FIG. 14B depicts an example of a capacitance sensor in a retracted position according to the present disclosure.
Figure 14C:
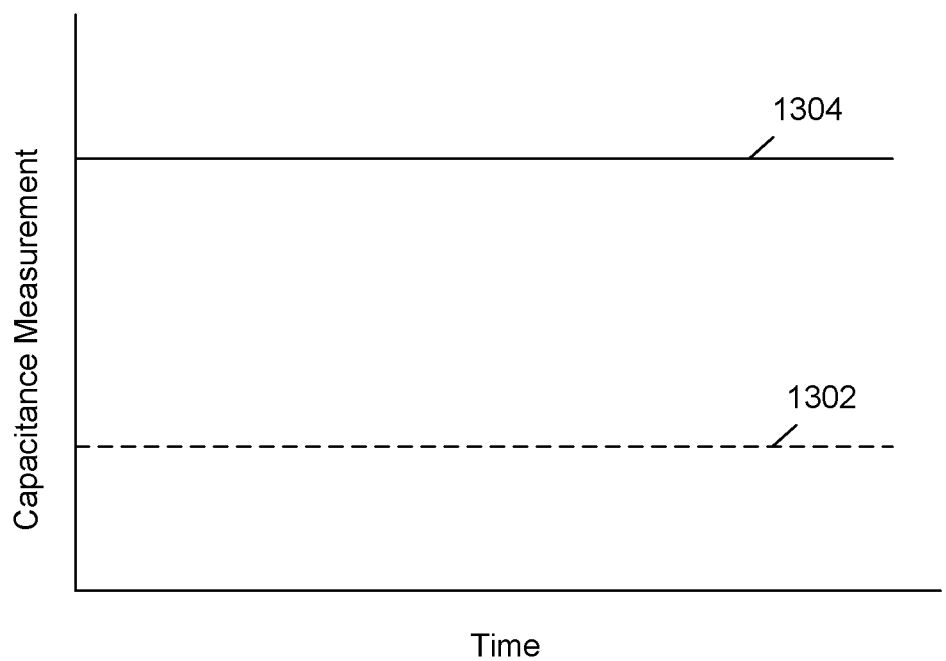
FIG. 14C depicts an example of a capacitance measurement according to the present disclosure.

FIG. 14A depicts an example of a retracted movable element 200 where the capacitance senor 212 is incorporated into the side of the movable member 200, and FIG. 14B depicts a side view of capacitance sensor 212 in a retracted position where the face plate 204 and the striker plate 900 are aligned. The measurements from the capacitance sensor 212 are depicted in FIG. 14C. In this example, the capacitance is higher (measurement 1304) when the movable member is retracted than when the movable member is extended into free space (measurement 1302). In some cases, the measurement of a retracted movable member and an extended movable member into the opening of the striker plate may be similar. However, in some examples, the differences between the materials or sizes of the striker plate 900 and the face plate 204 may cause the measurements between the retracted position and the extended position into the opening of the striker plate to be different enough that the system can distinguish between these two situations based on the capacitance measurement alone. In other examples, the capacitance measurement in combination with another type of input may be used to determine the position of the movable member.

Figure 15A:
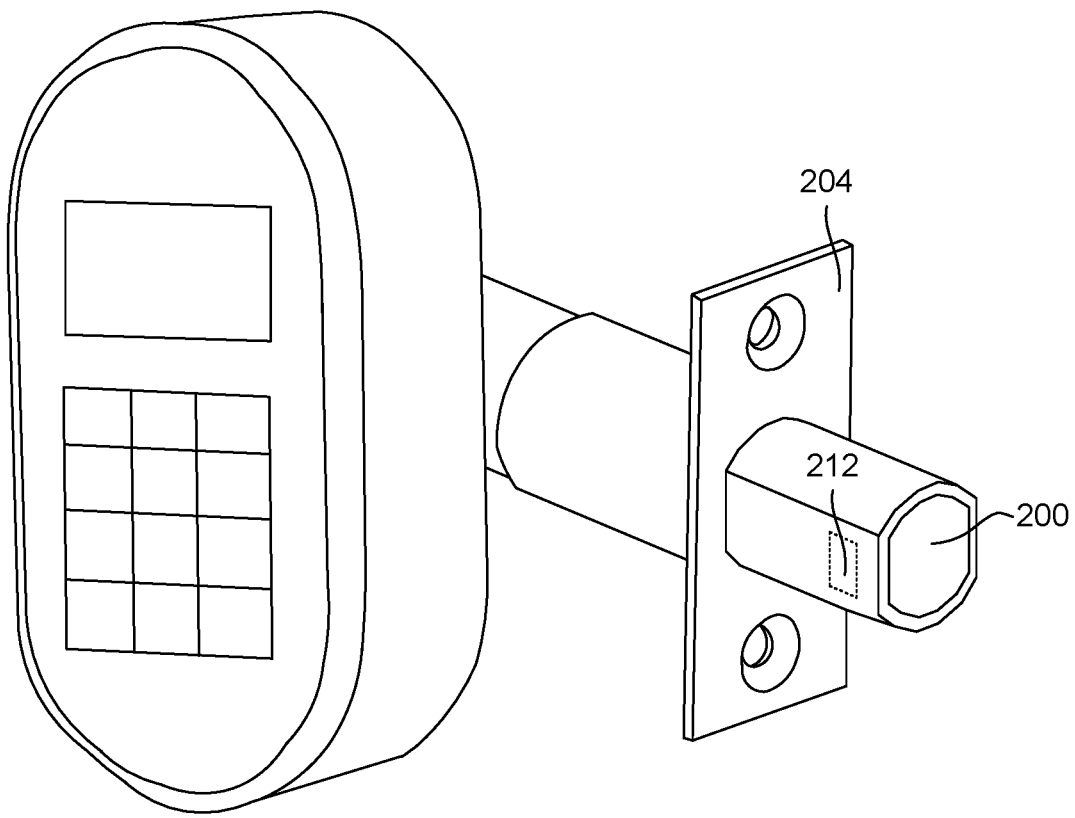
FIG. 15A depicts an example of a capacitance sensor in an extended movable element according to the present disclosure.
Figure 15B:
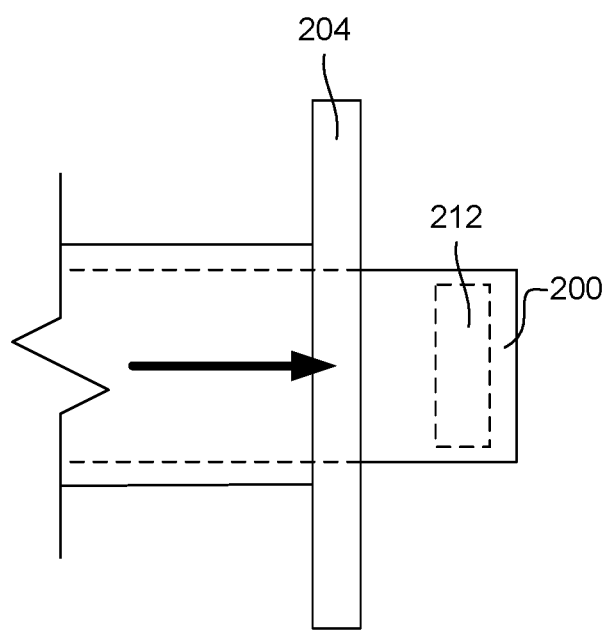
FIG. 15B depicts an example of a capacitance sensor in an extended position according to the present disclosure.
Figure 15C:
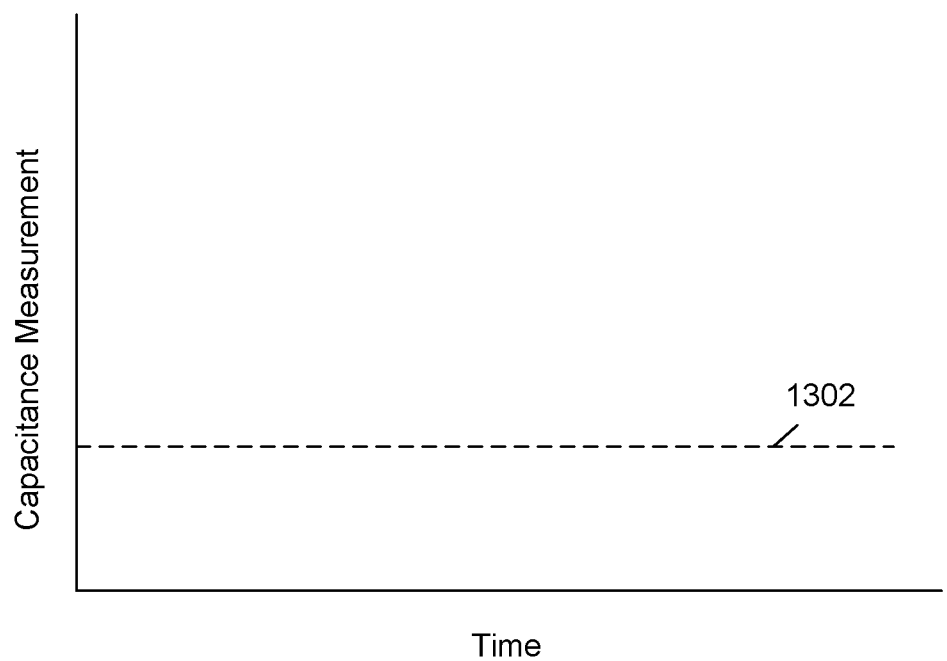
FIG. 15C depicts an example of a capacitance measurement according to the present disclosure.

FIG. 15A depicts an example of a capacitance sensor 212 in an extended movable element, and FIG. 15B depicts a side view of the embodiment of FIG. 15A. The capacitance measurements for FIGS. 15A and 15B are depicted in FIG. 15C. In this example, the capacitance measurement 1302 may be the baseline measurement since there is no structure adjacent to the capacitance sensor 212 that affects the capacitance. As a result, the system may determine that the movable member 200 is extended into free space when the baseline measurement is recorded. As a result, the system may determine that the closure member is open and that the movable member 200 is extended.

Figure 16:
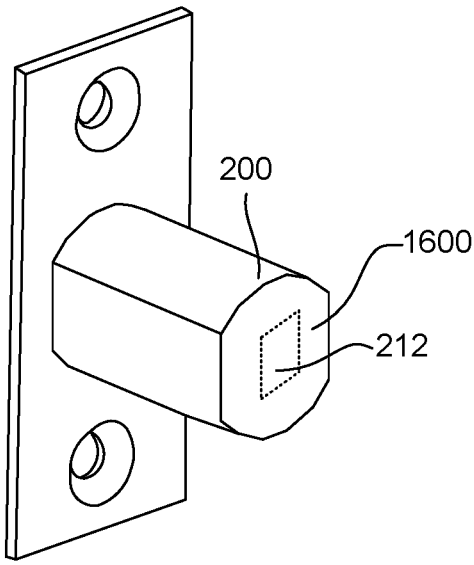
FIG. 16 depicts an alternative example of a capacitance sensor incorporated into a movable member according to the present disclosure.
Figure 17:
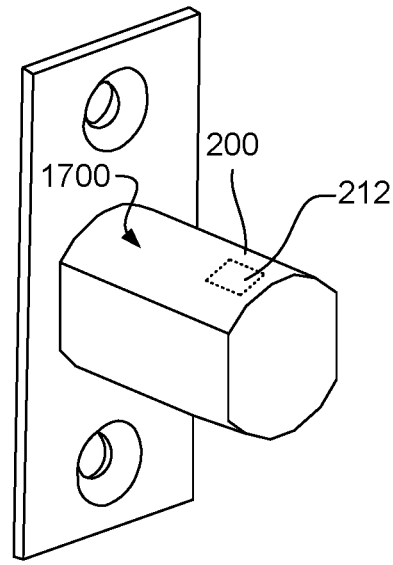
FIG. 17 depicts an alternative example of a capacitance sensor incorporated into a movable member according to the present disclosure.
Figure 18:
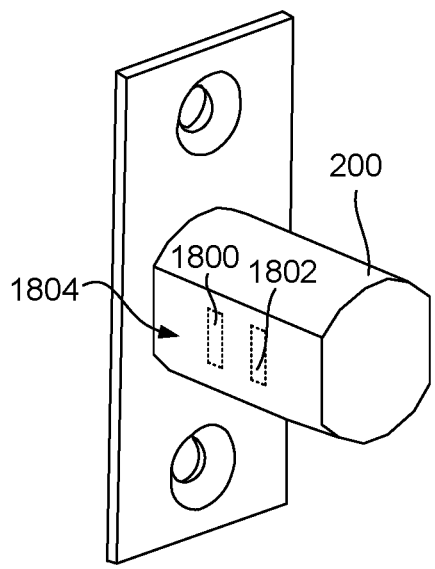
FIG. 18 depicts an alternative example of a capacitance sensor incorporated into a movable member according to the present disclosure.
Figure 19:
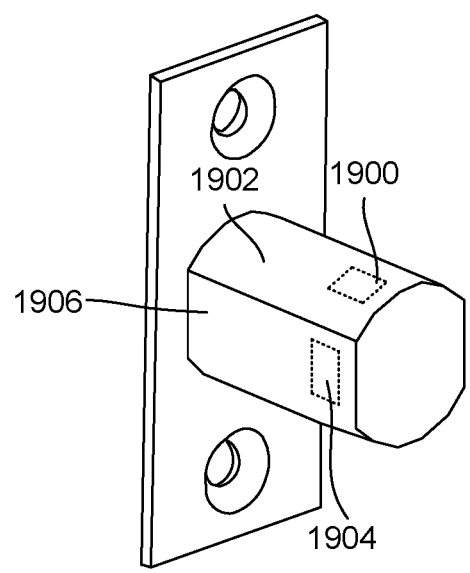
FIG. 19 depicts an alternative example of a capacitance sensor incorporated into a movable member according to the present disclosure.

FIGS. 16-19 depict a non-exhaustive number of alternatives placements for the capacitance sensor 212 in the movable member 200. In the example of FIG. 16, the capacitance sensor 212 is disposed in an outwardly facing surface 1600 of the movable member 200. In the example of FIG. 17, the capacitance sensor 212 is disposed on a top side 1700 of the movable member 200. In FIG. 18, two individual capacitance sensors 1800, 1802 are disposed on the same side 1804 of the movable member 200. FIG. 19 depicts an example, where a first capacitance sensor 1900 is disposed on a first side 1902 of the movable member 200 and a second capacitance sensor 1904 is disposed on a second side 1906 of the movable member 200.

Figure 20C:
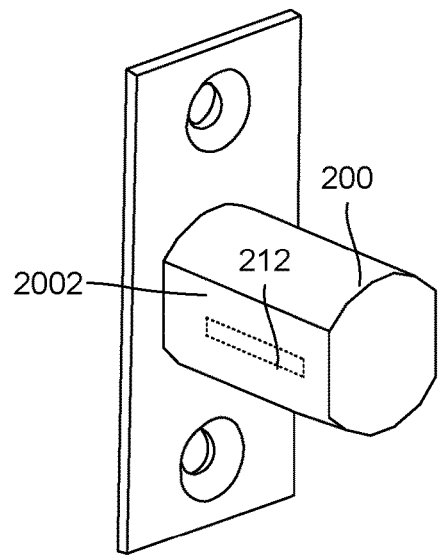
FIG. 20C depicts an example of a capacitance measurement according to the present disclosure.
Figure 20C:
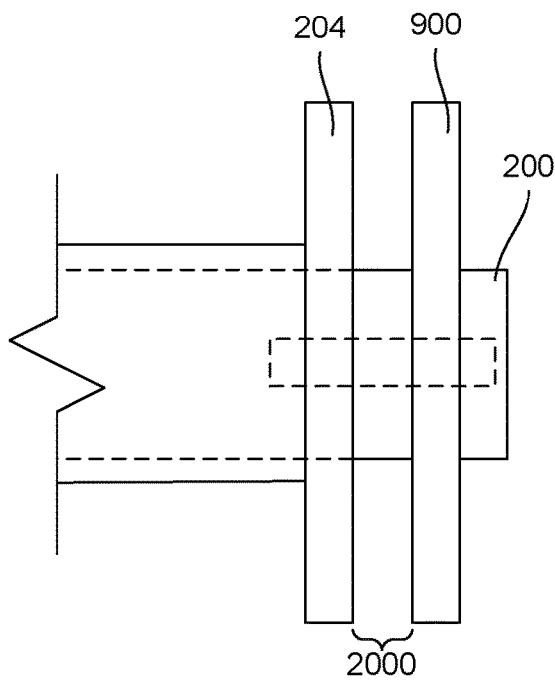
Figure 20C:
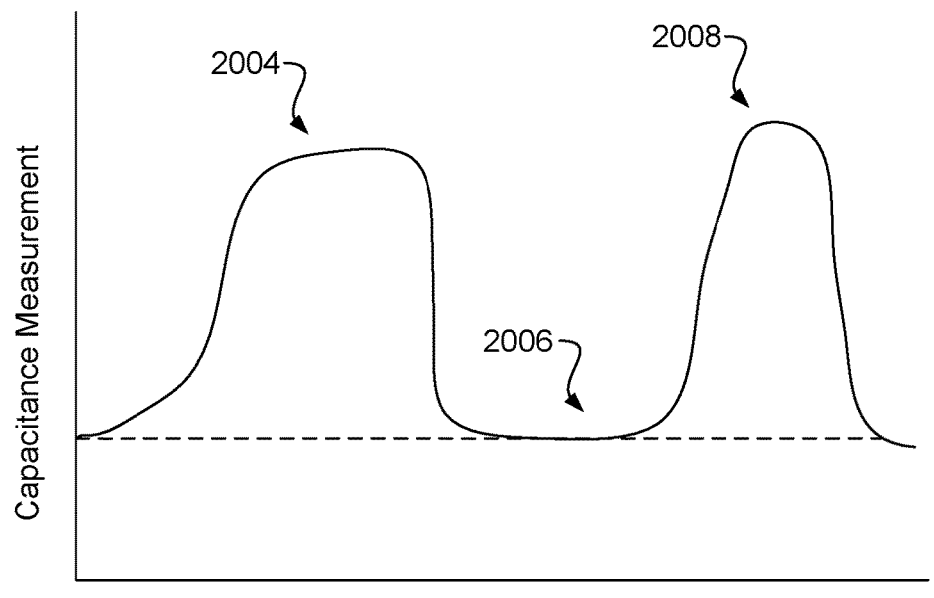

FIGS. 20A and 20B depict an example of a capacitance sensor 212 incorporated into a movable member 200. In this example, the capacitance sensor 212 is incorporated into a side 2002 of the movable member 200 and is long enough to span a gap 2000 between the face plate 204 and the striker plate 900. FIG. 20C depicts an example of a capacitance measurement that may be recorded with the embodiment depicted in FIGS. 20A and 20B. For example, the capacitance sensor 212 includes multiple electrodes integrated into a grid that can record individual capacitance measurements at different locations within the grid, and the capacitance sensor 212 may measure distinct measurements for both the striker plate 900 and the face plate 204. In an example where the movable member 200 is extended so that the capacitance sensor 212 overlaps with both the striker plate 900 and the face plate 204, a first capacitance increase 2004 from a baseline measurement 2006 may correspond to the location of the face plate 204 adjacent to the capacitance sensor 212, and a second capacitance increase 2008 from the baseline measurement 2006 may correspond to the location of the striker plate 900 adjacent to the capacitance sensor 212.

A capacitance sensor 212 as described in the embodiment of FIGS. 20A and 20B may be used to determine whether the movable member is extended into the striker plate opening, extended into free space, or retracted depending on the location and number of capacitance increases recorded by the capacitance sensor 212. While this example has been described with a single capacitance sensor depicting multiple capacitance measurements, in some examples, multiple capacitance sensors may be used to acquire the multiple capacitance measurements.

Figure 21:
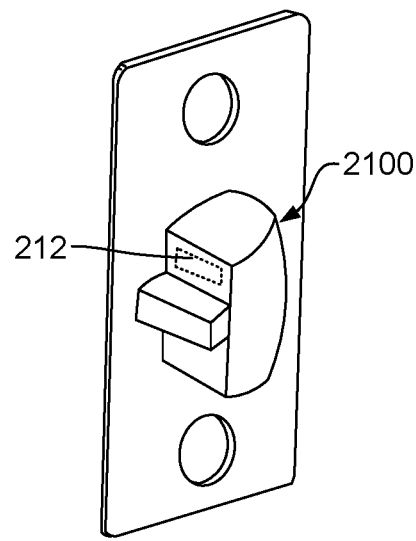
FIG. 21 depicts an example of a capacitance sensor incorporated into a movable member according to the present disclosure.
Figure 22:
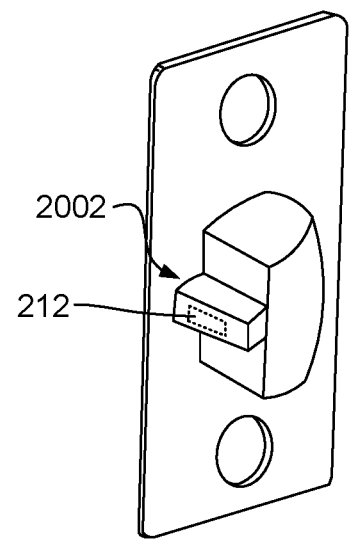
FIG. 22 depicts an example of a capacitance sensor incorporated into a movable member according to the present disclosure.
Figure 23:
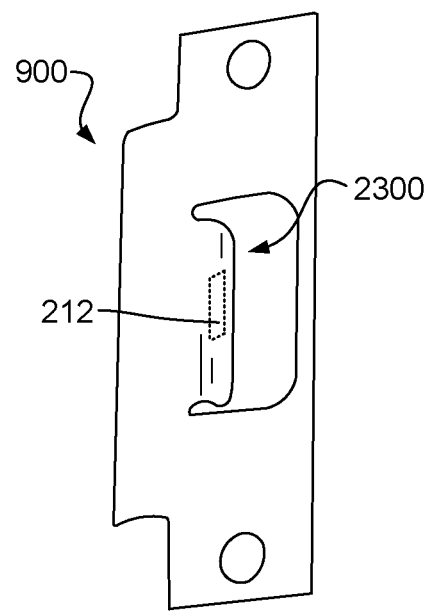
FIG. 23 depicts an example of a capacitance sensor incorporated into a striker plate according to the present disclosure.
Figure 24:
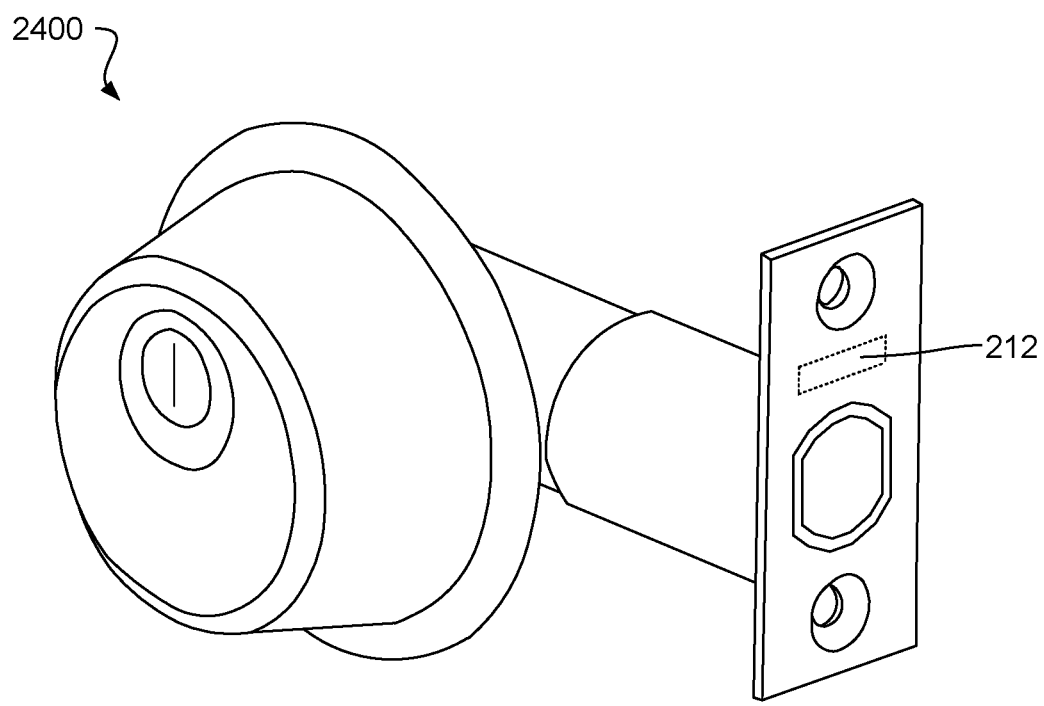
FIG. 24 depicts an example of a locking mechanism according to the present disclosure.

While the figures above have depicted the capacitance sensor 212 in various parts of the locking mechanism, latching mechanisms, and striker plates, the capacitance sensor 212 may be disposed in any appropriate location. For example, FIG. 21 depicts the capacitance sensor 212 in a latching member 2100, FIG. 22 depicts the capacitance sensor 212 disposed in a dead latch plunger 2200, and FIG. 23 depicts an example of the capacitance sensor 212 disposed on an inside curved portion 2300 of a striker plate 900. Further, the capacitance sensor 212 may be disposed into any appropriate lock. For example, FIG. 24 depicts the capacitance sensor 212 integrated into a manual locking mechanism 2400 that does not have a control panel like the locking mechanisms depicted in FIG. 2A. A manual locking mechanism 2400 may include a wireless transmitter, processing resources, memory, a power sources, or another component that can be used to operate the capacitance sensor 212, to store the capacitance measurement, transmit the capacitance measurement, or combinations thereof.

Figure 25:
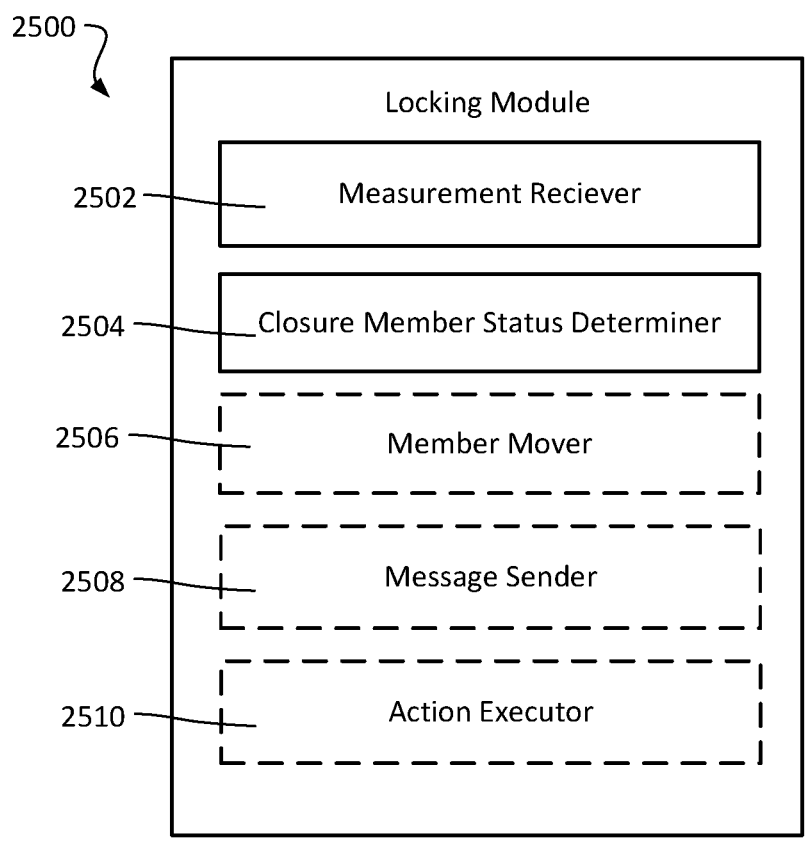
FIG. 25 depicts an example of a locking module according to the present disclosure.

FIG. 25 depicts an example of a locking module 2500. In this example, the locking module 2500 includes programmed instructions in memory and may include associated firmware, logic, processing resources, memory resources, power sources, processing resources, hardware, or other types components to carry out the tasks of the locking module 2500. The locking module 2500 includes a capacitance measurement receiver 2502 and a door status determiner 2504. In some examples, the locking module may additionally include a member mover 2506, a message sender 2508, and/or an action executor 2510.

The capacitance measurement receiver 2502 may receive the capacitance measurement from the capacitance sensor. The capacitance measurement may include a self-capacitance measurement, a mutual capacitance measurement, another type of capacitance measurement, or combinations thereof. In some cases, the capacitance measurement may be stored in measurement of an electrical property that can be used to determine the capacitance measurement. For example, the value received by the capacitance measurement receiver 2502 may be a voltage value, a resistance value, an impedance value, a current value, another type of value, or combinations thereof. These values may be used to calculate the capacitance.

The closure member status determiner 2504 may determine the status of the closure member. For example, the closure member status determiner 2504 may determine that the closure member is open, closed, aligned, misaligned, or has another status based on the capacitance measurement.

The member mover 2506 may cause a movable member; such as a bolt, deadbolt, latch, plunger, sliding bolt, hook, pin, or another type of movable member; to move in response to either receiving the capacitance measurement and/or determining the status of the closure member. In some cases, the member mover 2506 causes the movable member to retract if it is determined that the closure member is open. In other examples, the member mover 2506 may cause the movable member to extend if it is determined that the closure member is closed and/or aligned. The member mover 2506 may be a part that is incorporated into a smart lock to cause a deadbolt to extend or retract. In some examples, the member mover 2506 may cause a spring, a solenoid, magnets, pumps, fluids, motors, or other types of actuators to activate to cause the movable member to move.

The message sender 2508 may cause a message to be sent to a designated user. The message may be sent in response to an event, such as determining the status of the closure member and/or having taken an action. In some examples, the message includes the status of the closure member. In other examples, the message includes that the locking mechanism has been locked or unlocked. In some examples, the message may include a request. For example, in response to determining that the closure member is open, the message may include a request for the user to send instructions on whether to attempt to close the closure member, to send a message to someone else, to activate a security protocol on the premise, another set of instructions, or combinations thereof.

The action executor 2510 may cause an action to occur in response to determine the closure status. For example, in response to determining that the closure member is open, the action executor 2510 may cause the closure member to close, to send a message, to retract the movable member, take another action, increase surveillance on the premise, or combinations thereof.

Figure 26:
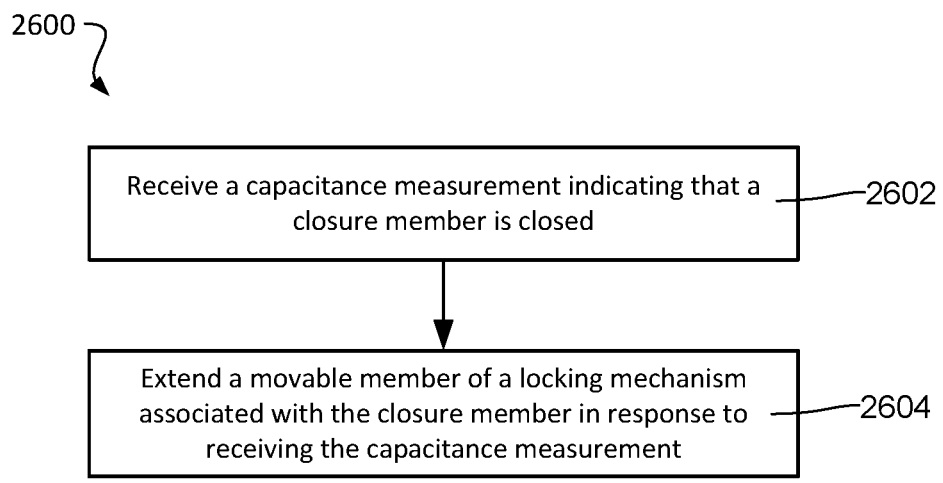
FIG. 26 depicts an example of a method of extending a movable member according to the present disclosure.

FIG. 26 depicts an example of a method 2600 of extending a movable member. This method 2600 may be performed based on the description of the devices, module, and principles described in relation to FIGS. 1-25. In this example, the method 2600 includes receiving 2602 a capacitance measurement indicating that a closure member is closed and extending 2604 a movable member of a locking mechanism associated with the closure member in response to receiving the capacitance measurement.

Figure 27:
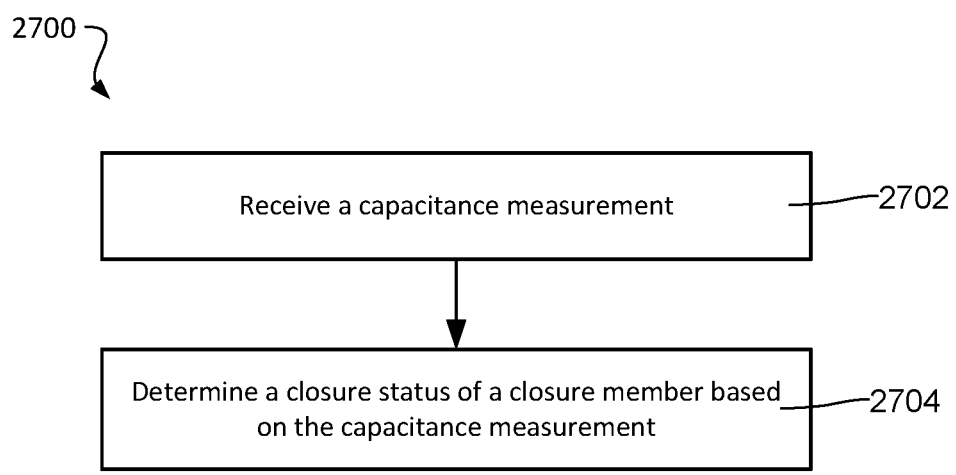
FIG. 27 depicts an example of a method of determining a closure status according to the present disclosure.

FIG. 27 depicts an example of a method 2700 of determining a closure status. This method 2700 may be performed based on the description of the devices, module, and principles described in relation to FIGS. 1-25. In this example, the method 2700 includes receiving 2702 a capacitance measurement and determining 2704 a closure status of a closure member based on the capacitance measurement.

Figure 28:
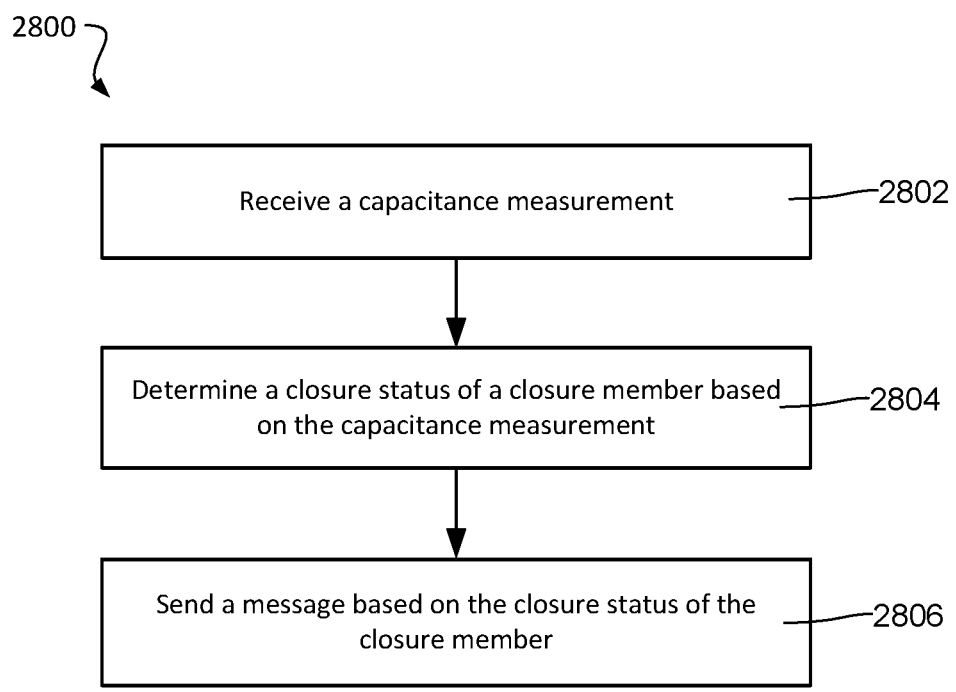
FIG. 28 depicts an example of a method of determining a closure status according to the present disclosure.

FIG. 28 depicts an example of a method of determining a closure status. This method 2800 may be performed based on the description of the devices, module, and principles described in relation to FIGS. 1-25. In this example, the method 2800 includes receiving 2802 a capacitance measurement, determining 2804 a closure status of a closure member based on the capacitance measurement, and sending 2806 a message based on the closure status of the closure member.

Figure 29:
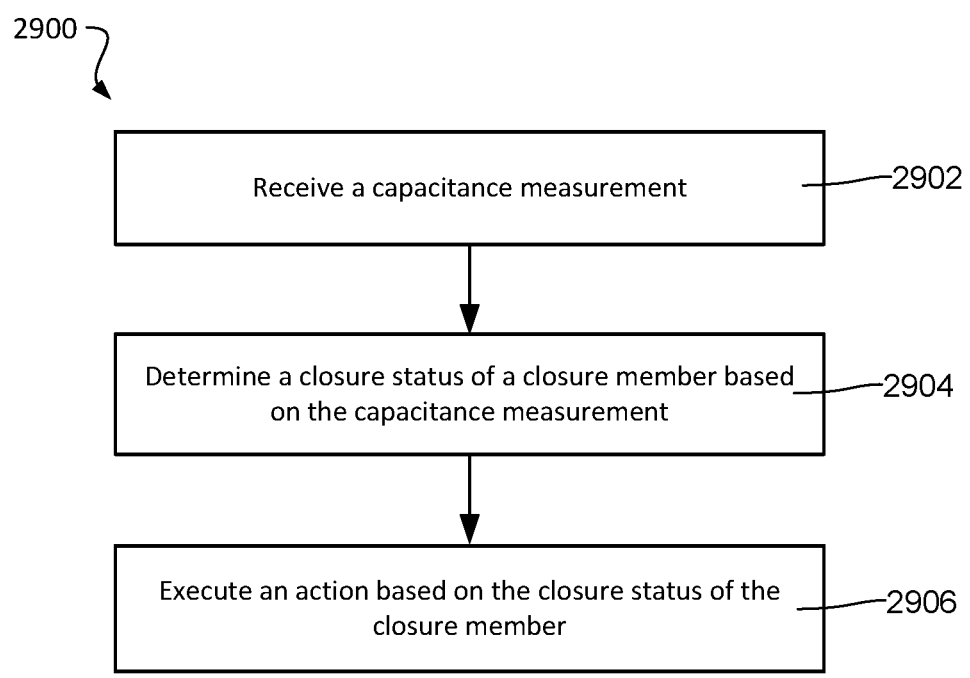
FIG. 29 depicts an example of a method of executing an action based on a capacitance measurement according to the present disclosure.

FIG. 29 depicts an example of a method of executing an action based on a capacitance measurement. This method 2900 may be performed based on the description of the devices, module, and principles described in relation to FIGS. 1-25. In this example, the method 2900 includes receiving 2902 a capacitance measurement, determining 2904 a closure status of a closure member based on the capacitance measurement, and executing 2906 an action based on the closure status of the closure member.

These components may, individually or collectively, be implemented with one or more Application Specific Integrated Circuits (ASICs) adapted to perform some or all of the applicable functions in hardware. Alternatively, the functions may be performed by one or more other processing units (or cores), on one or more integrated circuits. In other embodiments, other types of integrated circuits may be used (e.g., Structured/Platform ASICs, Field Programmable Gate Arrays (FPGAs) and other Semi-Custom ICs), which may be programmed in any manner known in the art. The functions of each unit may also be implemented, in whole or in part, with instructions embodied in a memory, formatted to be executed by one or more general or application-specific processors.

It should be noted that the methods, systems and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted or combined. Also, features described with respect to certain embodiments may be combined in various other embodiments. Different aspects and elements of the embodiments may be combined in a similar manner Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Moreover, as disclosed herein, the term "memory" or "memory unit" may represent one or more devices for storing data, including read-only memory (ROM), random access memory (RAM), magnetic RAM, core memory, magnetic disk storage mediums, optical storage mediums, flash memory devices or other computer-readable mediums for storing information. The term "computer-readable medium" includes, but is not limited to, portable or fixed storage devices, optical storage devices, wireless channels, a sim card, other smart cards, and various other mediums capable of storing, containing or carrying instructions or data.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a computer-readable medium such as a storage medium. Processors may perform the necessary tasks.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

The invention claimed is:

1. An apparatus, comprising,
a capacitance sensor;
a processor in communication with the capacitance sensor;
a locking mechanism in communication with the processor;
the capacitance sensor is incorporated into a movable member of the locking mechanism;
and
memory comprising programmed instructions that cause the processor, when executed, to:
determine a closure status of a closure member based on a measurement from the capacitance sensors;
wherein the movable member is a sliding bolt;
wherein the capacitance sensor is a mutual capacitance sensor that includes:
a transmit electrode incorporated into the movable element and in communication with a power source; and
a sense electrode incorporated into the movable element;
wherein the capacitance measurement is detected by the sense electrode and represents the capacitance between the transmit electrode and the sense electrode.

2. The apparatus of claim 1, wherein the programmed instructions further cause the processor, when executed, to move a movable member incorporated into the locking mechanism.

3. The apparatus of claim 2, wherein the programmed instructions cause the processor, when executed, to extend the movable member outward when the closure status of the closure member is closed.

4. The apparatus of claim 1, wherein the programmed instructions determine that the closure status is closed when the capacitance measurement is high from capacitance sensor being in proximity to a striker plate incorporated into a frame of the closure member.

5. The apparatus of claim 1, wherein the programmed instructions determine that the closure status is open when the capacitance measurement is low from capacitance sensor being away from a striker plate incorporated into a frame of the closure member.

6. The apparatus of claim 1, wherein the capacitance sensor is incorporated into a side surface of the movable member that is disposed along a length of the movable member.

7. The apparatus of claim 1, wherein two individual capacitance sensors are disposed on the same side of the movable member.

8. The apparatus of claim 1, wherein the capacitance sensor is incorporated into a side surface of the movable member where the capacitance sensor is long enough to span a gap between a face plate of the locking mechanism and a face plate of a frame of a closure member.

9. The apparatus of claim 1, wherein an electrically conductive pathway connects an electrode of the capacitance sensor to an integrated circuit of the locking mechanism.

10. The apparatus of claim 1, wherein the capacitance sensor is wireles sly connected to an integrated circuit of the locking mechanism.

11. The apparatus of claim 1, wherein the capacitance sensor is located on an outwardly facing surface of the movable member.

12. An apparatus, comprising,
a locking mechanism;
a movable member incorporated into the locking mechanism;
a capacitance sensor incorporated into the locking mechanism;
a processor in communication with the capacitance sensor;
the locking mechanism includes a capacitance input of a panel;
the processor includes an integrated circuit configured to interpret inputs from the capacitance input from the panel and also configured to interpret inputs from the capacitance sensor; and
memory comprising programmed instructions that cause the processor, when executed, to:
receive a capacitance measurement from the capacitance sensor; and
move the movable member in response to the capacitance measurements; wherein the movable member is a sliding bolt;
wherein the capacitance sensor is a self-capacitance sensor that includes:
an electrode in communication with a power source;
wherein the capacitance between the electrode and an object of a frame of the closure member changes as the object of the frame gets closer to the electrode.

13. The apparatus of claim 12, wherein the movable member is a dead bolt.

14. A computer program product comprising a non-transitory computer readable medium storing instructions executable by a processor to:
   receive a capacitive measurement from a capacitive sensor disposed in a movable member of a locking mechanism;
   determine a closure status of a closure member based on the capacitance measurement from the capacitance sensors;
   wherein the movable member is a sliding bolt;
   wherein the capacitance sensor is a mutual capacitance sensor that includes:
   a transmit electrode incorporated into the movable element and in communication with a power source; and
   a sense electrode incorporated into the movable element;
   wherein the capacitance measurement is detected by the sense electrode and represents the capacitance between the transmit electrode and the sense electrode.

15. The computer program product of claim 14, wherein the instructions are executable by the processor to:
   move a movable member of a locking mechanism based on the closure status of the closure member.

16. The computer program product of claim 14, wherein the instructions are executable by the processor to:
   determine that the movable member is retracted when the capacitance measurement is high.

* * * * *